(12) United States Patent
Shi et al.

(10) Patent No.: US 12,288,649 B2
(45) Date of Patent: Apr. 29, 2025

(54) MICRO-ELECTROMECHANICAL SYSTEM SWITCH AND COMMUNICATION DEVICE

(71) Applicants: Beijing BOE Technology Development Co., Ltd., Beijing (CN); BOE Technology Group Co., Ltd., Beijing (CN)

(72) Inventors: Yingli Shi, Beijing (CN); Yanzhao Li, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/028,435

(22) PCT Filed: Apr. 18, 2022

(86) PCT No.: PCT/CN2022/087492
§ 371 (c)(1),
(2) Date: Mar. 24, 2023

(87) PCT Pub. No.: WO2023/201488
PCT Pub. Date: Oct. 26, 2023

(65) Prior Publication Data
US 2024/0312730 A1    Sep. 19, 2024

(51) Int. Cl.
*H01H 1/00*   (2006.01)
*B81B 3/00*   (2006.01)

(52) U.S. Cl.
CPC ......... *H01H 1/0036* (2013.01); *B81B 3/0051* (2013.01); *B81B 2203/0118* (2013.01); *H01H 2001/0042* (2013.01)

(58) Field of Classification Search
CPC ............ H01H 2057/006; H01H 59/00; H01H 59/0009; H01H 2205/004; H01H 2203/02;
(Continued)

(56) References Cited

U.S. PATENT DOCUMENTS

| | | |
|---|---|---|
| 6,307,169 B1 | 10/2001 | Sun et al. |
| 6,373,007 B1 | 4/2002 | Calcatera et al. |
| 6,570,750 B1 | 5/2003 | Calcatera et al. |
| 2005/0244099 A1 | 11/2005 | Pasch et al. |

(Continued)

FOREIGN PATENT DOCUMENTS

| | | |
|---|---|---|
| CN | 101276708 A | 10/2008 |
| CN | 101763986 A | 6/2010 |

(Continued)

*Primary Examiner* — Anthony R Jimenez
(74) *Attorney, Agent, or Firm* — ArentFox Schiff LLP; Michael Fainberg (57) ABSTRACT

The disclosure provides a micro-electromechanical system switch and a communication device. The micro-electromechanical system switch includes: a substrate; a DC bias line, arranged on one side of the substrate; a first signal transmission line and a second signal transmission line, arranged on the same side of the substrate as the DC bias line; a cantilever beam, arranged on a side, away from the substrate, of a layer on which the first signal transmission line is located; and a fixing structure, arranged on the side, away from the substrate, of the layer on which the first signal transmission line is located and not in contact with the first signal transmission line, where the fixing structure connects the free end and the substrate.

20 Claims, 10 Drawing Sheets

(58) Field of Classification Search
CPC ........ H01H 1/0036; H01H 57/00; H01H 1/00;
H01H 2001/0042; B81C 2201/0109;
B81C 2201/013; B81C 2201/0167; B81C
2201/017; B81C 2203/00; B81C
2203/0136; B81C 2203/0172; B81C 1/00;
B81C 1/00015; B81C 1/00119; B81C
1/00182; B81C 2203/01; B81C
2203/0015; B81C 2203/00365; B81C
2203/00476; B81C 2203/00619; B81C
2203/00626; B81C 2203/00666; B81B
2203/00; B81B 2203/0118; B81B
2203/0136; B81B 2201/01; B81B
2201/014; B81B 2203/0315; B81B
2203/04; B81B 3/00; B81B 3/0018; B81B
3/0035; B81B 3/004; B81B 3/0072; B81B
3/0021; H01L 41/1136
USPC ........................................................ 200/514
See application file for complete search history.

(56) References Cited

U.S. PATENT DOCUMENTS

| | | |
|---|---|---|
| 2007/0040637 A1 | 2/2007 | Yee et al. |
| 2008/0062013 A1 | 3/2008 | Face et al. |
| 2009/0146773 A1 | 6/2009 | Kang |
| 2009/0190284 A1 | 7/2009 | Konishi et al. |
| 2010/0156577 A1 | 6/2010 | Wang et al. |
| 2011/0102875 A1 | 5/2011 | Yang et al. |
| 2013/0134529 A1 | 5/2013 | Nakatani et al. |

FOREIGN PATENT DOCUMENTS

| | | |
|---|---|---|
| CN | 201518299 U | 6/2010 |
| CN | 103137385 A | 6/2013 |
| CN | 101431172 B | 9/2013 |
| CN | 103280615 A | 9/2013 |
| CN | 104021995 A | 9/2014 |
| CN | 110137634 A | 8/2019 |
| TW | 201117253 A | 5/2011 |

MICRO-ELECTROMECHANICAL SYSTEM SWITCH AND COMMUNICATION DEVICE

CROSS-REFERENCE TO RELATED APPLICATIONS

The disclosure is a National Stage of International Application No. PCT/CN2022/087492, filed on Apr. 18, 2022, which is hereby incorporated by reference in their entireties.

FIELD

The present disclosure relates to the technical field of micro-electromechanical systems, and in particular to a micro-electromechanical system switch and a communication device.

BACKGROUND

A micro-electromechanical system (MEMS) switch for transmission of radio frequency (RF) signals is a miniature micromechanical switch that can be produced using conventional micro-electromechanical system fabrication techniques. Compared with the conventional silicon diode (PIN) and field-effect transistor (FET), the micro-electromechanical system switch has advantages of low insertion loss, high isolation, high linearity, low power consumption, low cost, and wide band, and is increasingly being applied to the fields such as mobile terminals, aviation, radar, and wireless communication.

SUMMARY

Embodiments of the present disclosure provide a micro-electromechanical system switch and a communication device, and the specific solutions are as follows.

In one aspect, an embodiment of the present disclosure provides a micro-electromechanical system switch, including:
  a substrate;
  a direct current (DC) bias line, arranged on one side of the substrate;
  a first signal transmission line and a second signal transmission line, arranged on the same side of the substrate as the DC bias line, where the first signal transmission line and the second signal transmission line are spaced side-by-side from the DC bias line, and the first signal transmission line and the second signal transmission line are arranged on two sides of the DC bias line;
  a cantilever beam, arranged on a side, away from the substrate, of a layer on which the first signal transmission line is located; where the cantilever beam spans the DC bias line and a gap is provided between the cantilever beam and the DC bias line in a direction perpendicular to the substrate; the cantilever beam includes a fixed end and a free end, the fixed end is connected to the second signal transmission line; an orthographic projection of the free end on the substrate is within an orthographic projection of the first signal transmission line on the substrate; and in the direction perpendicular to the substrate, a gap is provided between the free end and the first signal transmission line; and
  a fixing structure, arranged on the side, away from the substrate, of the layer on which the first signal transmission line is located and not in contact with the first signal transmission line; where the fixing structure connects the free end and the substrate.

In some embodiments, in the above micro-electromechanical system switch provided by an embodiment of the present disclosure, the fixing structure includes a connecting portion and a fixing portion; the connecting portion and the cantilever beam are disposed in a same plane parallel to the substrate, and the connecting portion is connected to the free end, and the fixing portion connects the connecting portion and the substrate; and a height of the fixing portion in the direction perpendicular to the substrate is larger than a thickness of the first signal transmission line in the direction perpendicular to the substrate.

In some embodiments, in the above micro-electromechanical system switch provided by an embodiment of the disclosure, within the plane, the connecting portion extends in a direction intersecting with the cantilever beam.

In some embodiments, in the above micro-electromechanical system switch provided by an embodiment of the disclosure, the connecting portion includes a first connecting portion, and within the plane, the first connecting portion extends from the free end towards a direction away from the free end; and the fixing portion includes a first fixing portion that connects the first connecting portion and the substrate.

In some embodiments, in the above micro-electromechanical system switch provided by an embodiment of the present disclosure, the connecting portion further includes a second connecting portion, and within the plane, the second connecting portion extends from the free end towards a direction away from the free end; and the second connecting portion and the first connecting portion are located on two sides of an extension direction of the cantilever beam; the fixing portion includes a second fixing portion that connects the second connecting portion and the substrate; and the second fixing portion and the first fixing portion are located on two sides of an extension direction of the cantilever beam.

In some embodiments, in the above micro-electromechanical system switch provided by an embodiment of the present disclosure, the fixing structure is disposed symmetrically about the extension direction of the cantilever beam.

In some embodiments, in the above micro-electromechanical system switch provided by an embodiment of the disclosure, the first connecting portion is disposed orthogonal to the cantilever beam and the second connecting portion is disposed orthogonal to the cantilever beam.

In some embodiments, in the above micro-electromechanical system switch provided by an embodiment of the disclosure, an included angle between the first connecting portion and the cantilever beam and an included angle between the second connecting portion and the cantilever beam are equal and both greater than 45° and less than 90°.

In some embodiments, in the above micro-electromechanical system switch provided by an embodiment of the disclosure, an included angle between the first connecting portion and the cantilever beam and an included angle between the second connecting portion and the cantilever beam are equal and both greater than 90° and less than 135°.

In some embodiments, in the above micro-electromechanical system switch provided by an embodiment of the present disclosure, the fixing structure is disposed asymmetrically about an extension direction of the cantilever beam.

In some embodiments, in the above micro-electromechanical system switch provided by an embodiment of the disclosure, an included angle between the first connecting portion and the cantilever beam is greater than 45° and less than 90°.

In some embodiments, in the above micro-electromechanical system switch provided by an embodiment of the disclosure, an included angle between the second connecting portion and the cantilever beam is greater than 90° and less than 135°.

In some embodiments, in the above micro-electromechanical system switch provided by an embodiment of the disclosure, an included angle between the second connecting portion and the cantilever beam is equal to 90°.

In some embodiments, in the above micro-electromechanical system switch provided by an embodiment of the disclosure, an included angle between the second connecting portion and the cantilever beam is greater than 45° and less than 90°, and an included angle between the second connecting portion and the cantilever beam is not equal to the included angle between the first connecting portion and the cantilever beam.

In some embodiments, in the above micro-electromechanical system switch provided by an embodiment of the disclosure, an included angle between the first connecting portion and the cantilever beam is greater than 90° and less than 135°.

In some embodiments, in the above micro-electromechanical system switch provided by an embodiment of the disclosure, an included angle between the second connecting portion and the cantilever beam is equal to 90°.

In some embodiments, in the above micro-electromechanical system switch provided by an embodiment of the disclosure, an included angle between the second connecting portion and the cantilever beam is greater than 90° and less than 135°, and an included angle between the second connecting portion and the cantilever beam is not equal to an included angle between the first connecting portion and the cantilever beam.

In some embodiments, in the above micro-electromechanical system switch provided by an embodiment of the disclosure, a distance between the fixing portion and the first signal transmission line in an extension direction of the DC bias line is greater than or equal to a distance between the connecting portion and the first signal transmission line in a direction perpendicular to the substrate.

In some embodiments, in the above micro-electromechanical system switch provided by an embodiment of the disclosure, a distance between the fixing portion and the first signal transmission line in an extension direction of the DC bias line is at least one time a distance between the connecting portion and the first signal transmission line in a direction perpendicular to the substrate.

In some embodiments, in the above micro-electromechanical system switch provided by an embodiment of the disclosure, the fixing portion is arranged adjacent an end of the first signal transmission line; and/or the fixing portion is arranged adjacent a gap between the first signal transmission line and the DC bias line.

In some embodiments, in the above micro-electromechanical system switch provided by an embodiment of the present disclosure, the fixing structure is integrally formed with the cantilever beam.

In some embodiments, in the above micro-electromechanical system switch provided by an embodiment of the present disclosure, the substrate is a flexible substrate.

In some embodiments, in the above micro-electromechanical system switch provided by an embodiment of the present disclosure, the DC bias line is symmetrically disposed about an extension direction of the cantilever beam.

In some embodiments, in the above micro-electromechanical system switch provided by an embodiment of the present disclosure, the DC bias line, the first signal transmission line, and the second signal transmission line are arranged in a same layer.

In some embodiments, the above micro-electromechanical system switch provided by an embodiment of the present disclosure further includes an isolation layer between a layer where the DC bias line is located and a layer where the cantilever beam is located; and an orthographic projection of the isolation layer on the substrate substantially coincides with an orthographic projection of the DC bias line on the substrate.

In another aspect, an embodiment of the present disclosure provides a communication device including the above micro-electromechanical system switch provided by embodiments of the present disclosure.

DETAILED DESCRIPTION OF THE EMBODIMENTS

In order to make objectives, technical solutions and advantages of the embodiments of the disclosure clearer, the technical solutions of the embodiments of the disclosure are described clearly and completely below with reference to the drawings of the embodiments of the disclosure. It should be noted that sizes and shapes of all features in the drawings do not reflect a true scale and are only intended to illustrate contents of the disclosure. Same or similar reference numbers denote same or similar elements or elements with same or similar function all the time.

Unless otherwise defined, technical or scientific terms used herein shall have the ordinary meaning as understood by those of ordinary skill in the art to which the present disclosure belongs. "First", "second" and similar words used in the specification and the claims of the present disclosure do not represent any order, quantity, or importance, but are merely used to distinguish different components. "Include" or "contain" and other similar words mean that an element or an item preceding the word cover elements or items and their equivalents listed after the word without excluding other elements or items. "Inner", "outer", "upper", "lower", etc. are only used to indicate a relative positional relationship, and when an absolute position of a described object changes, the relative positional relationship may also change accordingly.

Micro-electromechanical system switches may be divided into cantilever beam switches and fixed beam switches according to the mechanical structure; may be divided into series switches and parallel switches according to the connection manner of the switch in the radio frequency circuit; may be divided into capacitively coupled switches and ohmic contact switches according to the contact manner of the switch; and may be divided into electrostatic driving switches, electromagnetic driving switches, thermal driving switches, piezoelectric driving switches, shape memory alloy driving switches, and the like according to the driving mechanism.

Figure 1:
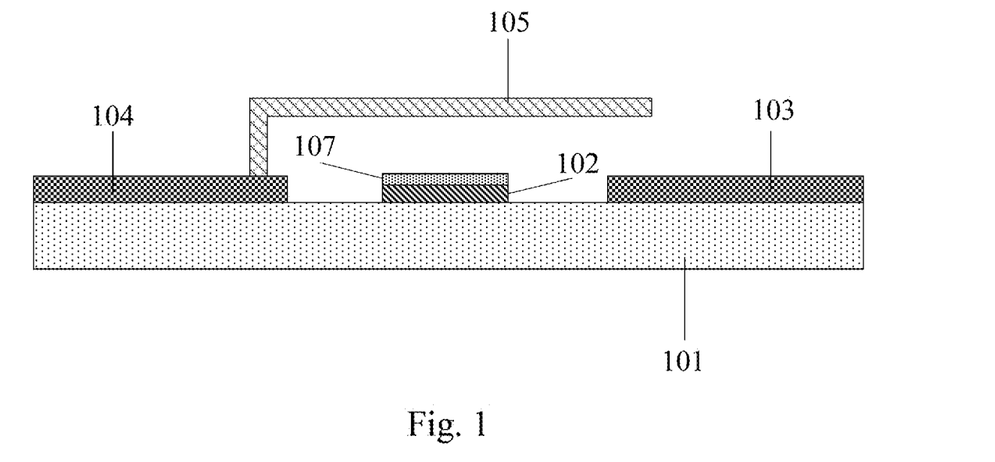
FIG. 1 is a structural schematic diagram of a micro-electromechanical system switch in the related art.

FIG. 1 shows a micro-electromechanical system switch in the related art, which is a cantilever beam switch that enables transmission of radio frequency signals through series connection and controls off or on of the switch by capacitive coupling under electrostatic driving. Such a micro-electromechanical system switch is characterized by a small driving voltage, a simple structure, easy compatibility with chip (IC) processes, a fast response speed (on the order of microseconds), a small volume, and the like.

Figure 2:
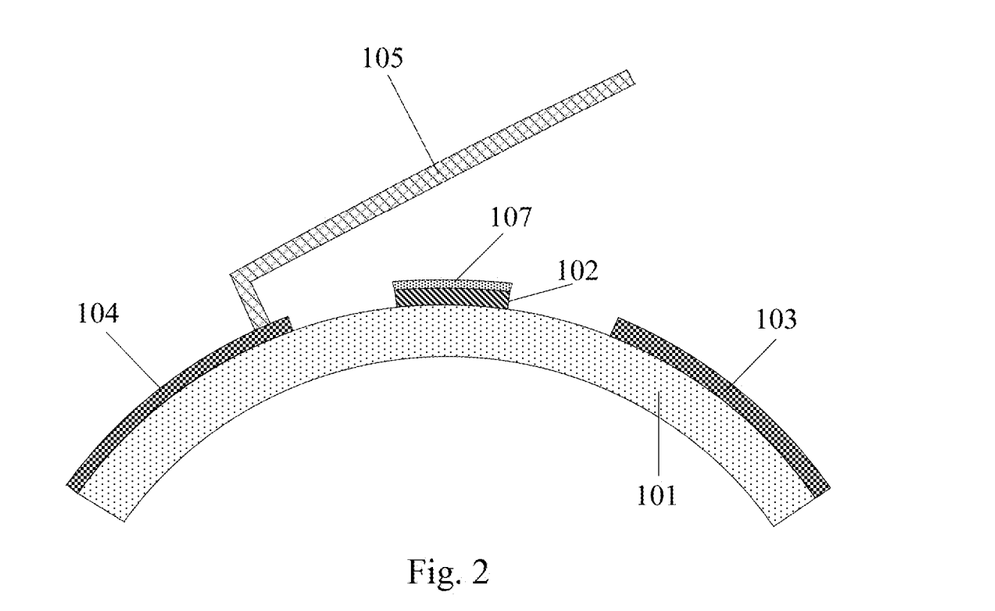
FIG. 2 is a schematic diagram of the micro-electromechanical system switch of FIG. 1 in a bent state.

As can be seen from FIG. 1, the micro-electromechanical system switch includes a substrate 101, a DC bias line 102, a first signal transmission line 103, a second signal transmission line 104, and a cantilever beam 105. The cantilever beam 105 crosses the DC bias wire 102, a free end of the cantilever beam 105 is suspended above the first signal transmission line 103, and a fixed end of the cantilever beam 105 is fixedly connected to the second signal transmission line 104. When the micro-electromechanical system switch is in the bent state shown in FIG. 2, a substantial upwarp of the free end of the cantilever beam 105 occurs, and the distance between the cantilever beam 105 and the DC bias line 102 is significantly increased, which leads to that the driving of the cantilever beam 105 cannot be completed normally by applying the driving voltage to the DC bias line 102. Therefore, such a micro-electromechanical system switch is not suitable for complex curved surface special-shaped integrated products (such as curved surface screens, flexible folding screens, etc.).

In order to address the above technical problems existing in the related art, embodiments of the present disclosure provide a micro-electromechanical system switch, as shown in FIGS. 3-6, including:

a substrate 101;

a DC bias line 102, arranged on one side of the substrate 101;

a first signal transmission line 103 and a second signal transmission line 104, arranged on the same side of the substrate as the DC bias line 102; where the first signal transmission line 103 and the second signal transmission line 104 are spaced side-by-side from the DC bias line 102, and the first signal transmission line 103 and the second signal transmission line 104 are arranged on two sides of the DC bias line 102;

a cantilever beam 105, arranged on a side, away from the substrate 101, of a layer on which the first signal transmission line 103 is located; where the cantilever beam 105 spans the DC bias line 102 and a gap is provided between the cantilever beam 105 and the DC bias line 102 in a direction perpendicular to the substrate 101; the cantilever beam 105 includes a fixed end 51 and a free end 52; the fixed end 51 is connected to the second signal transmission line 104; an orthographic projection of the free end 52 on the substrate 101 is within an orthographic projection of the first signal transmission line 103 on the substrate 101; and in the direction Z perpendicular to the substrate 101, a gap is provided between the free end 52 and the first signal transmission line 103 (i.e. the free end 52 is suspended above the first signal transmission line 103); and a fixing structure 106, arranged on the side, away from the substrate 101, of the layer on which the first signal transmission line 103 is located and not in contact with the first signal transmission line 103; where the fixing structure 106 connects the free end 52 and the substrate 101 to limit the warping of the free end 52 by the fixing structure 106.

Figure 7:
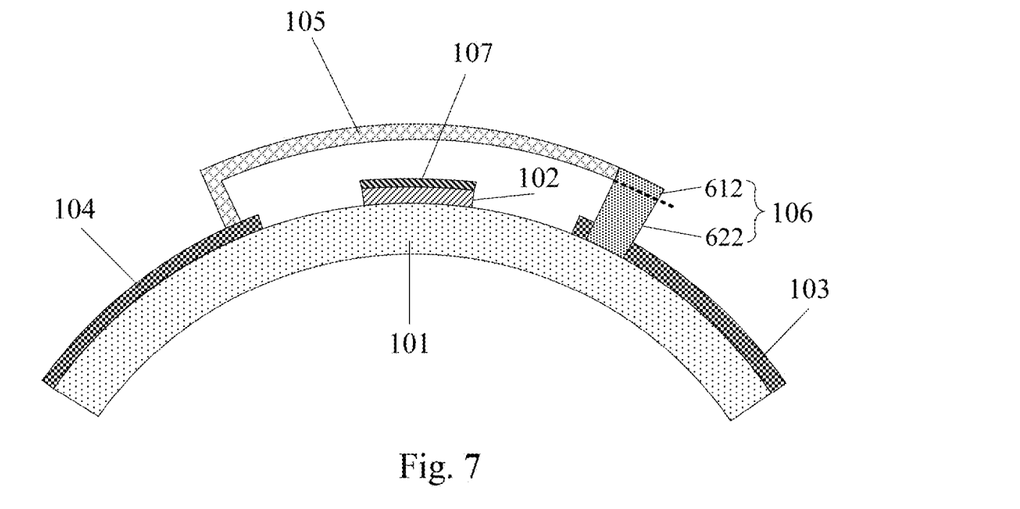
FIG. 7 is a schematic view of the micro-electromechanical system switch of FIG. 3 in a bent state.

In the above micro-electromechanical system switch provided by embodiments of the present disclosure, the fixing structure 106 may be employed to suppress warping of the free end 52 of the cantilever beam 105 in a bent state by adding the fixing structure 106 to the free end 52 of the cantilever beam 105, so that the distance between the cantilever beam 105 and the DC bias wire 102 may be less affected or even unaffected by bending deformation. As can be seen in FIG. 7, the free end 52 of the cantilever beam 105 of the present disclosure is not appreciably upwarped in the bent state, and the distance between the cantilever beam 105 and the DC bias wire 102 is not appreciably changed before the bending deformation. Accordingly, the present disclosure is effective in solving the technical problem of failure of device functions, such as the electrostatic drive response characteristics and the like, in the complex curved surface and special-shaped integrated application scene of the micro-electromechanical system switches, and guarantees the electrostatic drive response characteristics.

Figure 8:
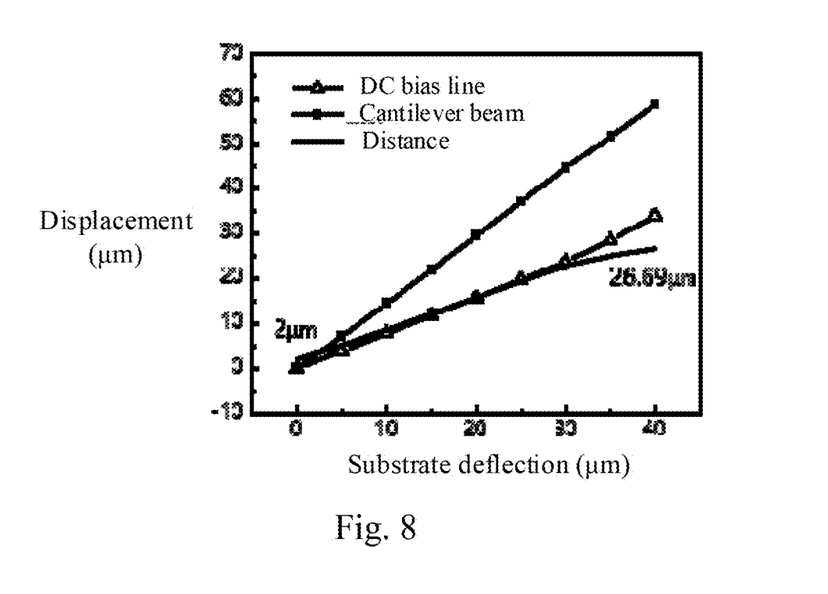
FIG. 8 is a diagram showing the variation of the distance between a cantilever beam and a DC bias line during bending of the micro-electromechanical system switch of FIG. 1.
Figure 9:
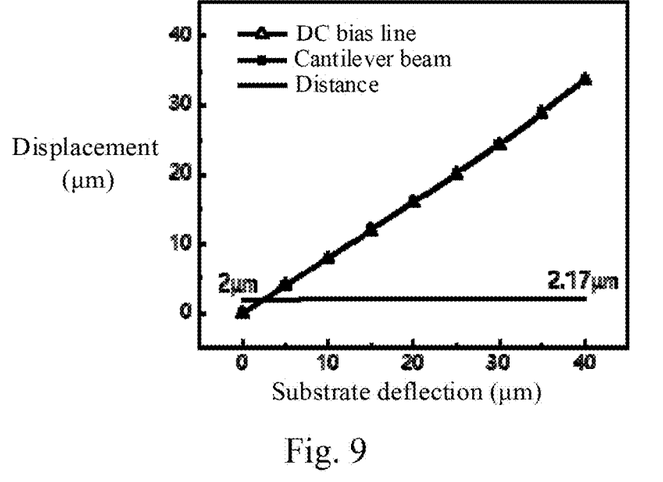
FIG. 9 is a diagram showing the variation of the distance between the cantilever beam and the DC bias line during bending of the micro-electromechanical system switch of FIG. 3.

The present disclosure also provides the change of distance between the cantilever beam 105 and the DC bias line 102 of the micro-electromechanical system switch in the related art and the change of distance between the cantilever beam 105 and the DC bias line 102 of the micro-electromechanical system switch of the present disclosure during the same bending process, as shown in FIGS. 8 and 9. The FIG. 8 shows the change of distance between the cantilever beam 105 and the DC bias line 102 of the micro-electromechanical system switch in FIG. 1 during the bending process, and FIG. 9 shows the change of distance between the cantilever beam 105 and the DC bias line 102 of the micro-electromechanical system switch in FIG. 3 during the same bending process. As can be seen in FIG. 8, the distance between the cantilever beam 105 and the DC bias line 102 of the micro-electromechanical system switch in FIG. 1 in the bent state is increased from an initial 2 μm to 26.69 μm, and the distance changes by 1234.5%. As can be seen in FIG. 9, when the same bending deformation occurs, the distance between the cantilever beam 105 and the DC bias line 102 in the micro-electromechanical system switch provided by the embodiments of the present disclosure changes from an initial 2 μm to 2.17 μm, and the distance changes by 8.5%. By comparison, it can be seen that the micro-electromechanical system switch provided by the embodiments of the present disclosure greatly reduces the change of distance between the cantilever beam 105 and the DC bias line 102, thereby ensuring efficient driving of the cantilever beam 105 by an applied driving voltage, and guaranteeing the electrostatic drive response characteristic of the micro-electromechanical system switch under bending deformation usage scenarios.

In some embodiments, in the above micro-electromechanical system switch provided by embodiments of the present disclosure, as shown in FIGS. 3 to 6, the fixing structure 106 includes a connecting portion (e.g., a first connecting portion 611, a second connecting portion 612) and a fixing portion (e.g., a first fixing portion 621, a second fixing portion 622); where the connecting portion (e.g., the first connecting portion 611, the second connecting portion 612) and the cantilever beam 105 are disposed in a same plane parallel to the substrate 101, and the connecting portion (e.g., the first connecting portion 611, the second connecting portion 612) is connected to the free end 52, the fixing portion (e.g., the first fixing portion 621, the second fixing portion 622) connects the substrate 101 and the connecting portion (e.g., the first connecting portion 611, the second connecting portion 612). Optionally, the fixing portion (e.g., the first fixing portion 621, the second fixing portion 622) may be located between an end, away from the free end 52, of the connecting portion (e.g. the first connecting portion 611, the second connecting portion 612) and the substrate 101; the fixing portion (e.g., the first fixing portion 621, the second fixing portion 622) is disposed vertically between the substrate 101 and the connecting portion (e.g., the first connecting portion 611, the second connecting portion 612); and the height $h_1$ of the fixing portion (e.g., the first fixing portion 621, the second fixing portion 622) in the direction Z perpendicular to the substrate 101 is larger than the thickness $h_2$ of the first signal transmission line 103 in the direction Z perpendicular to the substrate 101. This arrangement may avoid contact of the fixing structure 106 with the first signal transmission line 103, ensuring an off state of the micro-electromechanical system switch when no driving voltage is loaded on the DC bias line 102. Since in the fixing structure 106, the fixing portion (e.g., the first fixing portion 621, the second fixing portion 622) is fixed to the substrate 101, and the connecting portion (e.g., the first connecting portion 611, the second connecting portion 612) connects the free end 52 and the fixing portion (e.g., the first fixing portion 621, the second fixing portion 622), a restraining action of the fixing structure 106 against the free end 52 can be achieved, preventing warping of the free end 52 during bending deformation.

Figure 3:
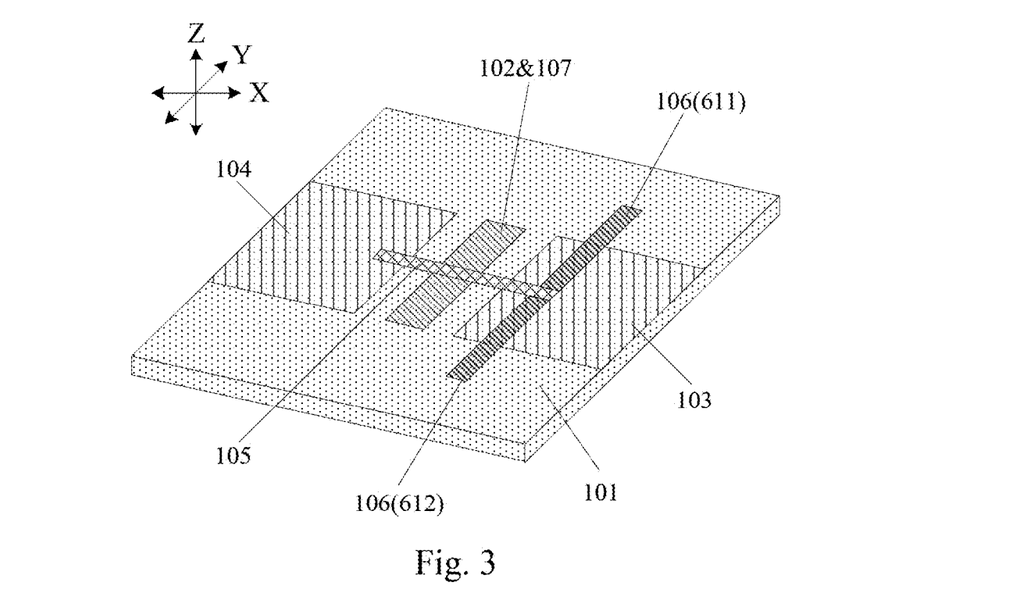
FIG. 3 is a structural schematic diagram of the micro-electromechanical system switch according to an embodiment of the present disclosure.
Figure 4:
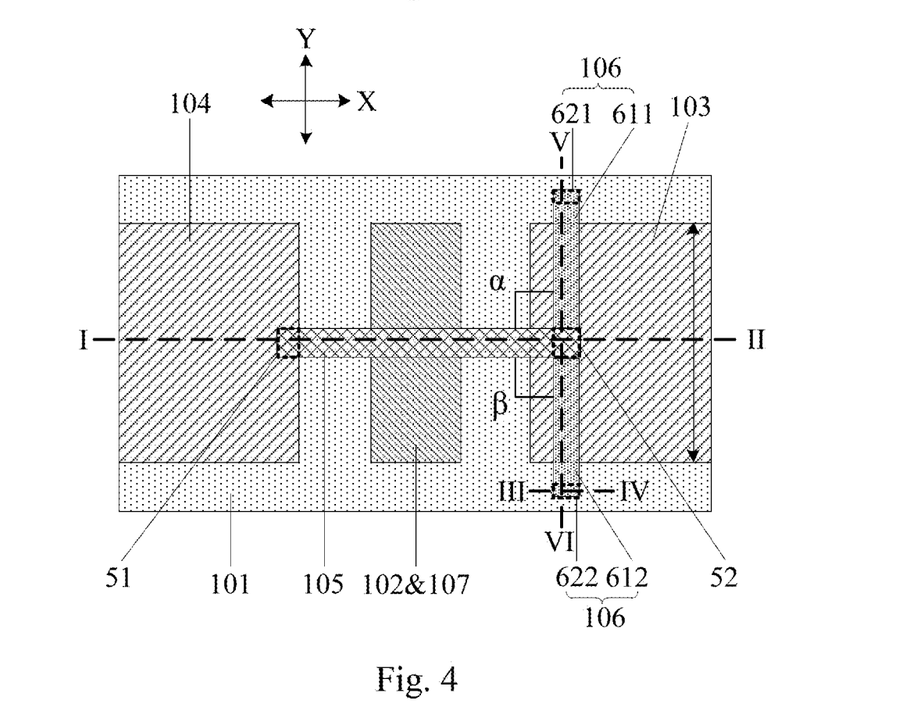
FIG. 4 is a top view of the micro-electromechanical system switch of FIG. 3.
Figure 10:
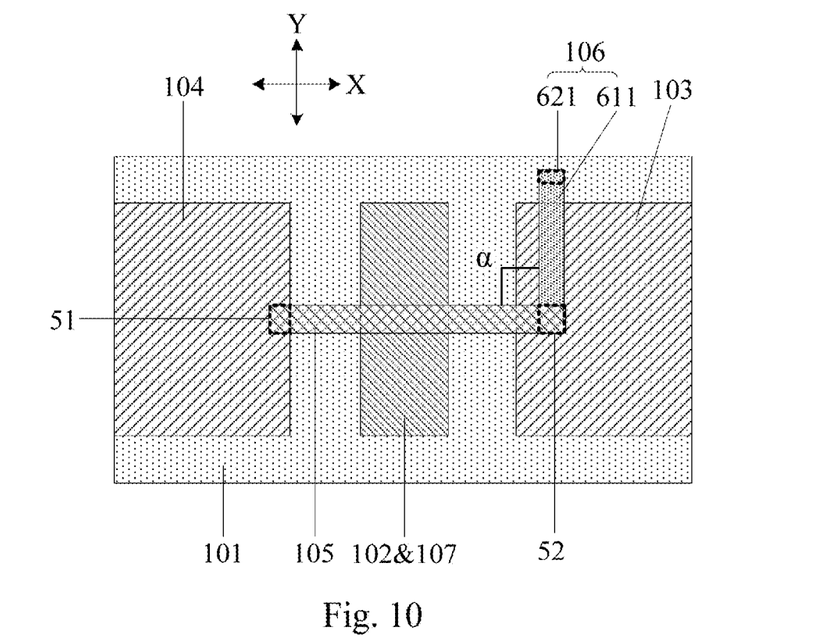
FIG. 10 is another structural schematic diagram of the micro-electromechanical system switch according to an embodiment of the present disclosure.
Figure 11:
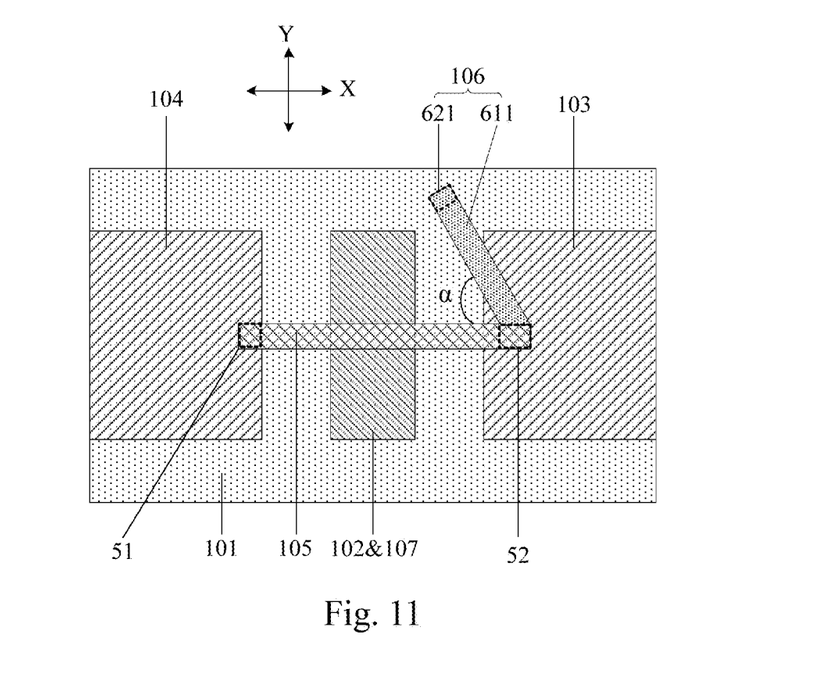
FIG. 11 is another structural schematic diagram of the micro-electromechanical system switch according to an embodiment of the present disclosure.
Figure 12:
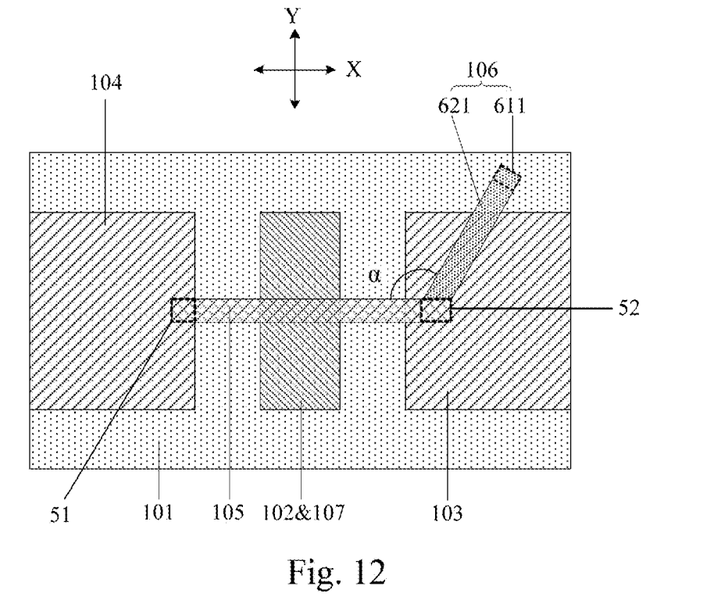
FIG. 12 is another structural schematic diagram of the micro-electromechanical system switch according to an embodiment of the present disclosure.

In some embodiments, in the above micro-electromechanical system switch provided by embodiments of the present disclosure, as shown in FIG. 3, FIG. 4, and FIG. 10, within the plane where the cantilever beam 105 is located, the connecting portion (e.g., the first connecting portion 611, second connecting portion 612) extends in a direction intersecting with the cantilever beam 105, so that there is a certain included angle between the fixing structure 106 and the cantilever beam 105, which prevents the positional relationship between the cantilever beam 105 and the fixing structure 106 from being equivalent to a straight double-ended fixed beam. Since in a case that the positional relationship between the cantilever beam 105 and the fixing structure 106 is equivalent to the straight double-ended fixed beam, the moment of electrostatic force acting on the free end 52 is greater, and the greater electrostatic force must be obtained by increasing the driving voltage of the DC bias wire 102 to realize the driving of electrostatic force on the cantilever beam 105. The positional relationship between the cantilever beam 105 and the fixing structure 106 of the present disclosure is not equivalent to the straight double-ended fixed beam, thus effectively reducing the driving voltage and power consumption.

In some embodiments, in the above micro-electromechanical system switch provided by embodiments of the present disclosure, as shown in FIG. 3, FIG. 4, FIG. 6, and FIGS. 10-12, the connecting portion may include a first connecting portion 611, and in a plane where the cantilever beam 105 is located, the first connecting portion 611 extends from the free end 52 towards a direction away from the free end 52, which is equivalent to that the first connecting portion 611 and the free end 52 form a ray structure in which the free end 52 acts as an end point and intersects with the cantilever beam 105, so that the first connecting portion 611 is located on a side of the extension direction X of the cantilever beam 105. Correspondingly, the fixing portion may include the first fixing portion 621 that connects the first connecting portion 611 and the substrate 101.

In some embodiments, in the above micro-electromechanical system switch provided by embodiments of the present disclosure, as shown in FIG. 3 to FIG. 6, FIG. 13 to FIG. 19, the connecting portion may further include a second connecting portion 612, and in the plane where the cantilever beam 105 is located, the second connecting portion 612 extends from the free end 52 towards a direction away from the free end 52, which is equivalent to that the second connecting portion 612 and the free end 52 form a ray structure in which the free end 52 acts as an end point and intersects with the cantilever beam 105. Optionally, the second connecting portion 612 and the first connecting portion 611 are arranged on two sides of the extension direction X of the cantilever beam 105. Correspondingly, the fixing portion may include a second fixing portion 622 that connects the second connecting portion 612 and the substrate 101, and the second fixing portion 622 and the first fixing portion 621 are arranged on two sides of the extension direction X of the cantilever beam 105. By arranging the fixing structure 106 on two sides of the cantilever beam 105, the fixing structure 106 has stronger constraining force against the free end 52 of the cantilever beam 105, thereby more effectively preventing the free end 52 of the cantilever beam 105 from warping in a bent state.

Figure 13:
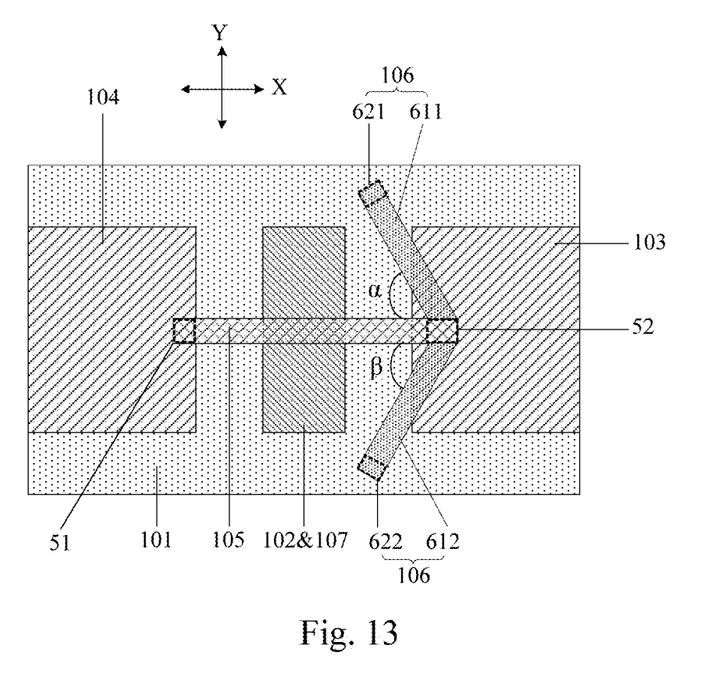
FIG. 13 is another structural schematic diagram of the micro-electromechanical system switch according to an embodiment of the present disclosure.
Figure 14:
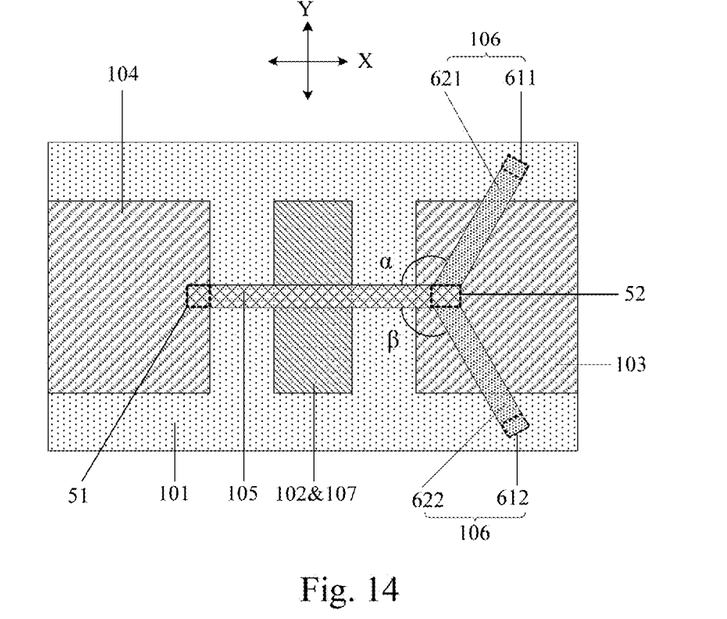
FIG. 14 is another structural schematic diagram of the micro-electromechanical system switch according to an embodiment of the present disclosure.

In some embodiments, in the above micro-electromechanical system switch provided by embodiments of the present disclosure, in order to better suppress warping of the free end 52, the fixing structure 106 may be disposed symmetrically about the extension direction X of the cantilever beam 105 as shown in FIG. 3, FIG. 4, FIG. 13, and FIG. 14. In this case, if the included angle between the connecting portion (e.g., the first connecting portion 611, the second connecting portion 612) and the cantilever beam 105 is too small, the free end 52 may upwarp when bending occurs such that the fixing structure 106 loses constraint on the free end 52, and thus the included angle between the connecting portion (e.g., the first connecting portion 611, the second connecting portion 612) and the cantilever beam 105 should not be too small in the present disclosure. Additionally, if the included angle between the connecting portion (e.g., the first connecting portion 611, the second connecting portion 612) and the cantilever beam 105 is too large, the positional relationship between the fixing structure 106 and the cantilever beam 105 approximates a double-ended fixed beam, which increases the driving voltage of the DC bias line 102, thus decreasing the electrostatic drive response characteristic of the micro-electromechanical system switch; and therefore the included angle between the connecting portion (e.g., the first connecting portion 611, the second connecting portion 612) and the cantilever beam 105 should not be too large in the present disclosure. Based on this, in the above micro-electromechanical system switch provided by embodiments of the present disclosure, in order to take into account the effect of restraining free end warping and ensure the low driving voltage of the micro-electromechanical system switch, as shown in FIG. 4, the first connecting portion 611 and the cantilever beam 105 may be disposed orthogonally, and the second connecting portion 612 and the cantilever beam 105 also may be disposed orthogonally, i.e., the included angle $\alpha$ between the first connecting portion 611 and the cantilever beam 105 and the included angle $\beta$ between the second connecting portion 612 and the cantilever beam 105 are 90°; or, as shown in FIG. 13, the included angle $\alpha$ between the first connecting portion 611 and the cantilever beam 105 and the included angle $\beta$ between the second connecting portion 612 and the cantilever beam 105 may be equal and greater than 45° and less than 90°, e.g., may each be 50°, 60°, 70°, 80°, etc.; or, as shown in FIG. 14, the included angle $\alpha$ between the first connecting portion 611 and the cantilever beam 105 and the included angle $\beta$ between the second connecting portion 612 and the cantilever beam 105 may be equal and greater than 90° and less than 135°, e.g., may each be 100°, 110°, 120°, 130°, etc.

Figure 15:
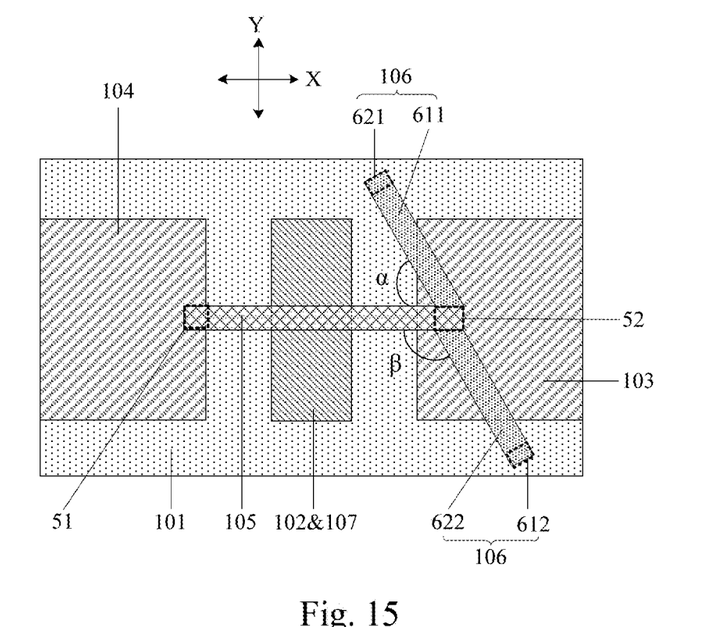
FIG. 15 is another structural schematic diagram of the micro-electromechanical system switch according to an embodiment of the present disclosure.
Figure 16:
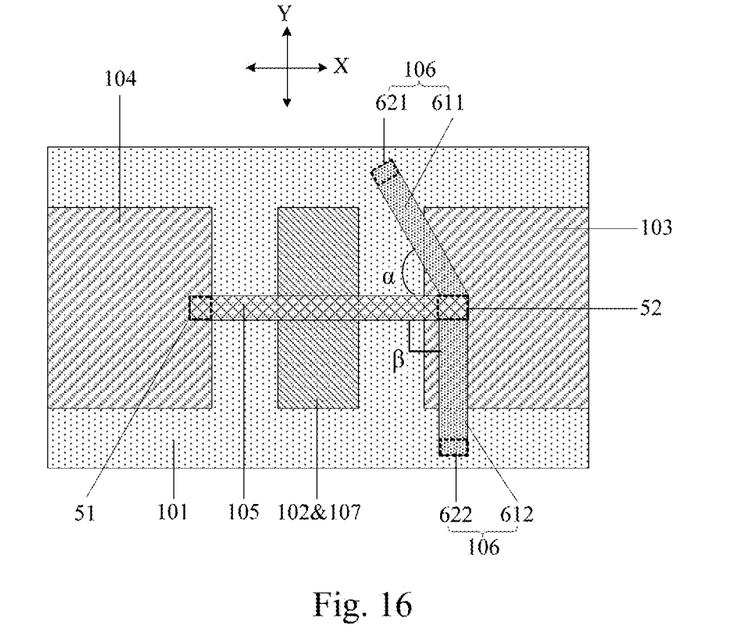
FIG. 16 is another structural schematic diagram of the micro-electromechanical system switch according to an embodiment of the present disclosure.
Figure 17:
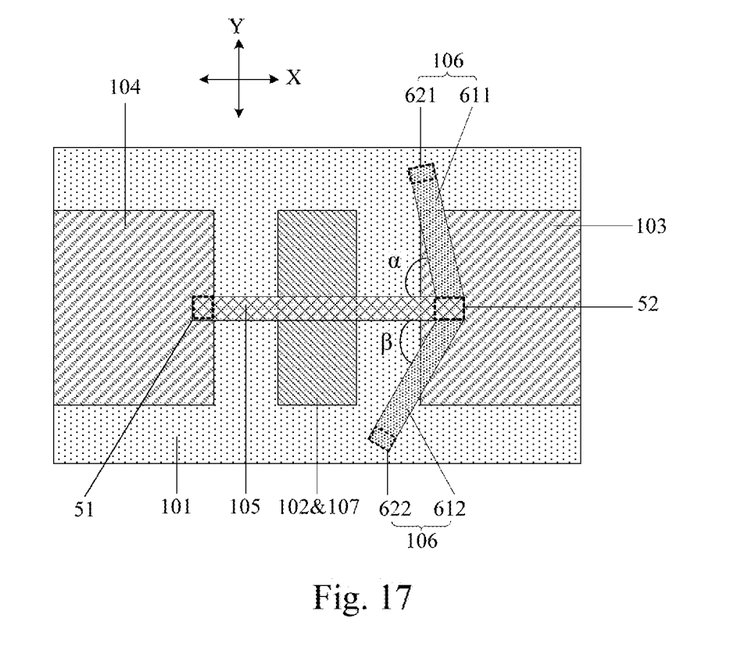
FIG. 17 is another structural schematic diagram of the micro-electromechanical system switch according to an embodiment of the present disclosure.
Figure 18:
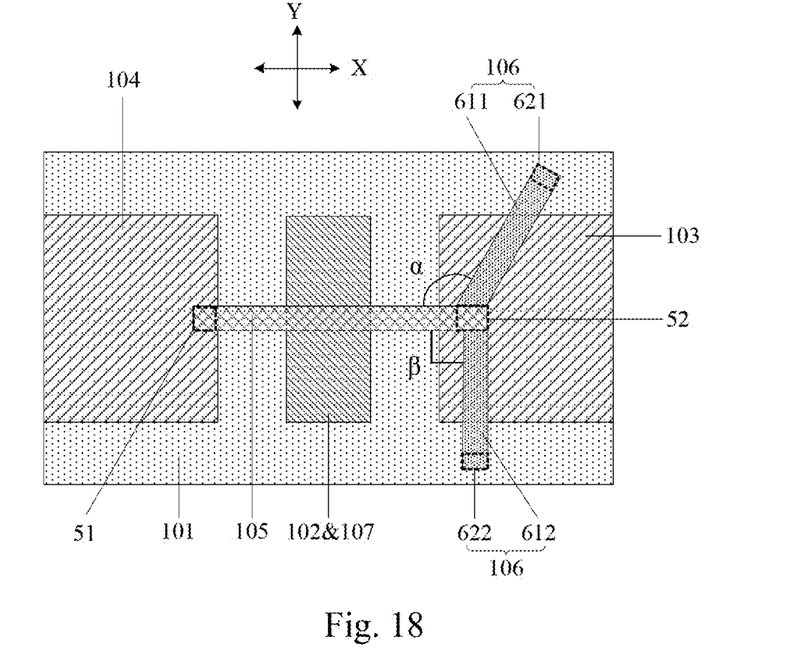
FIG. 18 is another structural schematic diagram of the micro-electromechanical system switch according to an embodiment of the present disclosure.
Figure 19:
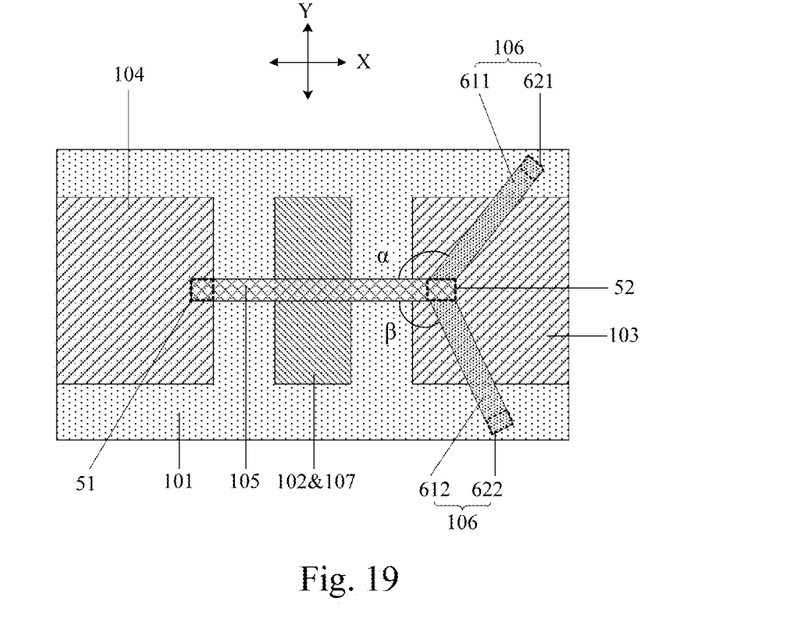
FIG. 19 is another structural schematic diagram of the micro-electromechanical system switch according to an embodiment of the present disclosure.

Of course, in some embodiments, as shown in FIGS. 15-19, the fixing structure 106 may also be disposed asymmetrically about the extension direction X of the cantilever beam 105, and the included angle $\alpha$ between the first connecting portion 611 and the cantilever beam 105 is not equal to the included angle $\beta$ between the second connecting portion 612 and the cantilever beam 105. In this case, as shown in FIGS. 15 to 17, the included angle $\alpha$ between the first connecting portion 611 and the cantilever beam 105 is greater than 45° and less than 90°; optionally, the included angle $\beta$ between the second connecting portion 612 and the cantilever beam 105 is greater than 90° and less than 135° in FIG. 15, the included angle $\beta$ between the second connecting portion 612 and the cantilever beam 105 is equal to 90° in FIG. 16, and the included angle $\beta$ between the second connecting portion 612 and the cantilever beam 105 is greater than 45° and less than 90° in FIG. 17; and $\beta$ is not equal to $\alpha$. In some embodiments, as shown in FIGS. 18 and 19, the included angle $\alpha$ between the first connecting portion 611 and the cantilever beam 105 may be greater than 90° and less than 135°; optionally, the included angle $\beta$ between the second connecting portion 612 and the cantilever beam 105 is equal to 90° in FIG. 18, and the included angle $\beta$ between the second connecting portion 612 and the cantilever beam 105 is greater than 90° and less than 135° in FIG. 19; and $\beta$ is not equal to $\alpha$.

Figure 6:
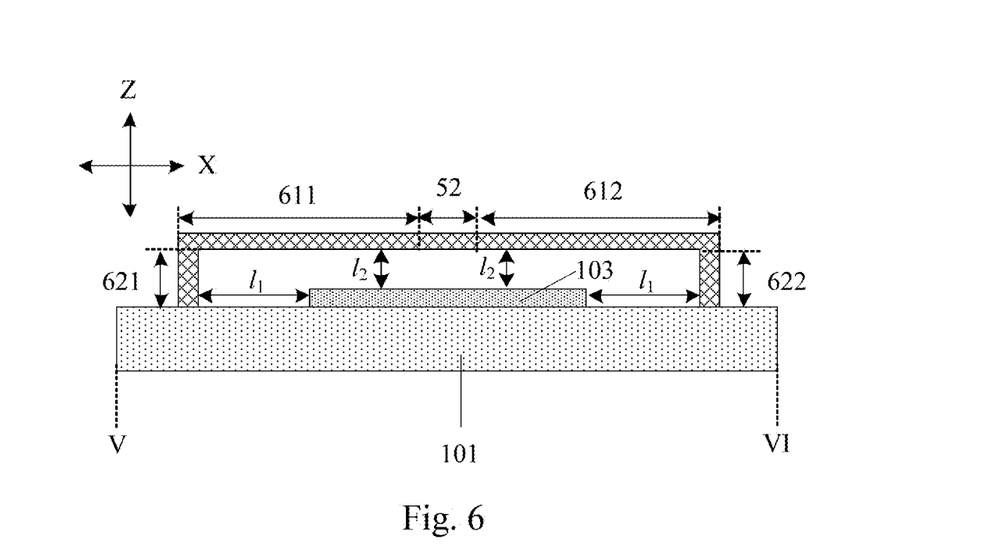
FIG. 6 is a sectional view along a line V-VI of FIG. 4.

In some embodiments, in the above micro-electromechanical system switch provided by embodiments of the present disclosure, as shown in FIG. 6, the distance $l_1$ between the fixing portion (e.g. the first fixing portion 621, the second fixing portion 622) and the first signal transmission line 103 in an extension direction X of the DC bias line 102 is greater than or equal to the distance $l_2$ between the connecting portion (e.g. the first connecting portion 611, the second connecting portion 612) and the first signal transmission line 103 in a direction Z perpendicular to the substrate 101, so that the distance between the fixing portion (e.g., the first fixing portion 621, the second fixing portion 622) and the first signal transmission line 103 may be large, thus avoiding interference with each other by forming coupling capacitance between them, and guaranteeing the electrostatic drive response characteristic of the micro-electromechanical system switch. Optionally, the distance $l_1$ between the fixing portion (e.g. the first fixing portion 621, the second fixing portion 622) and the first signal transmission line 103 in an extension direction X of the DC bias line 102 may be at least one time the distance $l_2$ between the connecting portion (e.g. the first connecting portion 611, the second connecting portion 612) and the first signal transmission line 103 in a direction Z perpendicular to the substrate 101.

In some embodiments, in the above micro-electromechanical system switch provided by embodiments of the present disclosure, as shown in FIG. 4, FIG. 10 to FIG. 19, the fixing portion (e.g. the first fixing portion 621, the second fixing portion 622) may be located adjacent an end of the first signal transmission line 103, and/or the fixing portion (e.g. the first fixing portion 621, the second fixing portion 622) may be located adjacent a gap between the first signal transmission line 103 and the DC bias line 102, which is equivalent to that the connecting portion (e.g., the first connecting portion 611, the second connecting portion 612) extends to the side where the end of the first signal transmission line 103 is located. Compared to a configuration in which the connecting portion (e.g. the first connecting portion 611, the second connecting portion 612) extends to the gap between the first signal transmission line 103 and the DC bias line 102, and the fixing portion (e.g. the first fixing portion 621, the second fixing portion 622) is arranged at the gap between the first signal transmission line 103 and the DC bias line 102, in the present disclosure, there may be more spaces on the side where the end of the first signal transmission line 103 is located to arrange the fixing portion, so as to effectively avoid short circuit of the fixing structure 106 and the DC bias wire 102 and/or the first signal transmission line 103.

In some embodiments, in the above-described micro-electromechanical system switch provided by embodiments of the present disclosure, the fixing structure 106 may be integrally formed with the cantilever beam 105, which may save the process of separately fabricating the fixing structure 106 and guarantee the connection effect of the fixing structure 106 and the cantilever beam 105. Of course, in some embodiments, the fixing structure 106 may also be independently disposed relative to the cantilever beam 105, without limitation herein.

In some embodiments, in the above micro-electromechanical system switch provided by embodiments of the present disclosure, the substrate 101 may be a flexible substrate for better application in the bendable and deformable scenes.

In some embodiments, in the above micro-electromechanical system switch provided by embodiments of the present disclosure, as shown in FIG. 3, FIG. 4, and FIGS. 10 to 19, the DC bias line 102 may be disposed symmetrically about the extension direction X of the cantilever beam 105 to facilitate the arrangement of the fixing structure 106 that is symmetrical about the cantilever beam 105.

Figure 5:
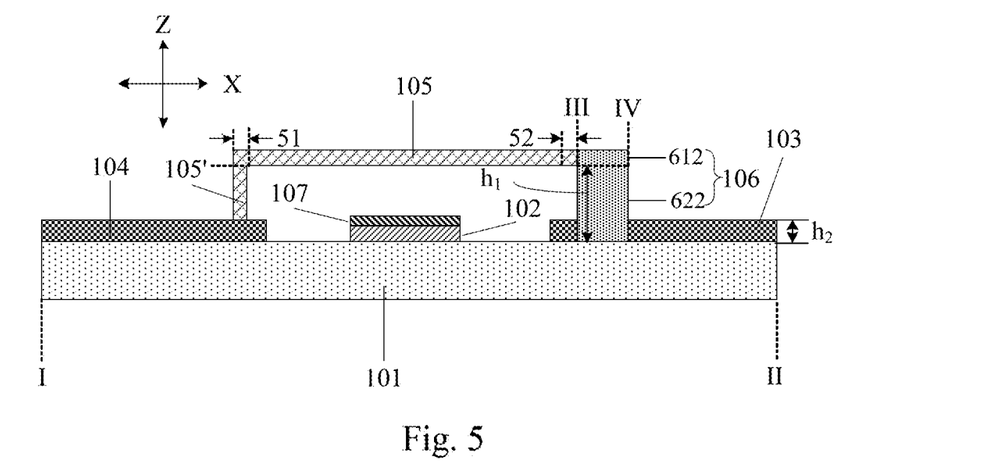
FIG. 5 is a spliced sectional view along a line I-II and a line III-IV of FIG. 4.

In some embodiments, in the above micro-electromechanical system switch provided by embodiments of the present disclosure, as shown in FIG. 5, the fixed end 51 of the cantilever beam 105 may be fixed to the second signal transmission line 104 by an anchoring part 105'; and in some embodiments, the cantilever beam 105 is integrally formed with the anchoring part 105'. In the micro-electromechanical system switch provided in the disclosure, when the DC bias line 102 is not loaded with the driving voltage, the cantilever beam 105 is not driven, the micro-electromechanical system switch is off, and a RF signal cannot be transmitted from the second signal transmission line 104 to the first signal transmission line 103; when the DC bias line 102 is loaded with a driving voltage, the electrostatic force generated by the driving voltage pulls down the free end 52 of the cantilever beam 105 to contact with the first signal transmission line 103, the micro-electromechanical system switch is on, and a RF signal is transmitted from the second signal transmission line 104 to the first signal transmission line 103 through the cantilever beam 105.

In some embodiments, in the above-described micro-electromechanical system switch provided by embodiments of the present disclosure, the DC bias line 102, the first signal transmission line 103, and the second signal transmission line 104 may be arranged in the same layer, i.e., the DC bias line 102, the first signal transmission line 103, and the second signal transmission line 104 may be fabricated using the same film layer and the same mask process to improve production efficiency and reduce production costs.

In some embodiments, in the above micro-electromechanical system switch provided by embodiments of the present disclosure, as shown in FIGS. 3-5, FIGS. 10-19, the micro-electromechanical system switch further includes an isolation layer 107 between a layer where the DC bias line 102 is located and a layer where the cantilever beam 105 is located, and an orthographic projection of the isolation layer 107 on the substrate 101 substantially coincides with an orthographic projection of the DC bias line 102 on the substrate 101, i.e., the orthographic projections of the two exactly coincide or are within the error range caused by production, measurement and other factors. The isolation layer 107 may avoid the effect of the driving voltage of the DC bias line 102 on the RF signal transmitted in the cantilever beam 105 when the micro-electromechanical system switch is on.

On the basis of the same inventive concept, embodiments of the present disclosure provide a communication device, including the above micro-electromechanical system switch provided by embodiments of the present disclosure, since the principle of solving the problem of the communication device is similar to the principle of solving the problem of the above-described micro-electromechanical system switch, the implementation of the communication device provided by embodiments of the present disclosure can refer to the implementation of the above-described micro-electromechanical system switch provided by embodiments of the present disclosure, and the repetition will not be repeated.

In some embodiments, the above-mentioned communication device provided by the embodiments of the present disclosure may be terminal equipment. The terminal equipment is a kind of equipment with a wireless transceiver function, which can be deployed on land, such as indoor or outdoor, hand-held, wearable or vehicle-mounted; it can also be deployed on the water, such as ships; it can also be deployed in the air, such as airplanes, balloons and satellites. The terminal equipment can be a mobile phone, a Pad, a computer with a wireless transceiver function, virtual reality (VR) terminal equipment, augmented reality (AR) terminal equipment, a wireless terminal in industrial control, a wireless terminal in self driving, a wireless terminal in remote medical, a wireless terminal in smart grid, a wireless terminal in transportation safety, a wireless terminal in a smart city, a wireless terminal in a smart home, etc. The terminal equipment may also be referred to as user equipment (UE), access terminal equipment, a UE unit, a UE station, a mobile radio station, a mobile station, a remote station, remote terminal equipment, mobile equipment, UE terminal equipment, terminal equipment, wireless communication equipment, a UE agent or a UE device, etc.

In some embodiments, the above described terminal equipment provided by the present disclosure can include a processor for controlling audio/video and logic functions of the terminal equipment, for example, the processor can include a digital signal processor, a microprocessor, an analog-to-digital converter, a digital-to-analog converter, an internal voice coder (VC), an internal data modem (DM), and the like. Further, the processor may include functions to operate one or more software programs, which may be stored in memory. The processor and stored software instructions may generally be configured to cause the terminal equipment to perform actions, for example, the processor can operate a connectivity program.

In some embodiments, the above-described terminal equipment provided by embodiments of the present disclosure may further include a user interface, which may include a headset or speaker, a microphone, an output device (e.g., display), an input device (e.g., a keypad, a touch screen, a joystick), etc., and may be operatively coupled to the processor. Accordingly, the processor may include a user interface circuit configured to control at least some functions of one or more elements (such as the speaker, the microphone, the display, or the like) of the user interface. The user interface circuit may be configured to control one or more functions of one or more elements of the user interface through computer program instructions (for example software and/or firmware) stored in a memory accessible to the processor. Although not shown, the terminal equipment may also include a battery for supplying power to various circuits associated with the mobile equipment, and the circuit, for example, provides mechanical vibration as a detectable output.

In some embodiments, the above described terminal equipment provided by embodiments of the present disclosure may further include one or more connection circuit modules for sharing and/or obtaining data. For example, the terminal equipment may include a short-range radio frequency transceiver and/or detector so that data may be shared with and/or obtained from the electronic equipment according to radio frequency techniques. In some embodiments, the terminal equipment may also include other short-range transceivers, for example, an infrared (IR) transceiver, a Bluetooth transceiver, a wireless universal serial bus (USB) transceiver, etc. The Bluetooth transceiver can operate in accordance with low-energy or ultra-low-energy Bluetooth techniques, where the terminal equipment can transmit and/or receive data to and/or from the electronic equipment in its vicinity, such as within 10 meters. In some embodiments, the terminal equipment can transmit and/or receive data to and/or from the electronic equipment according to various wireless networking techniques. Optionally, the wireless networking technologies include Wi-Fi, Wi-Fi low energy, WLAN technologies such as the IEEE 802.11 technology, the IEEE 802.15 technology, the IEEE 802.16 technology, and the like.

In some embodiments, in the above terminal equipment provided by embodiments of the present disclosure, a memory, such as a subscriber identity module (SIM), which may store information elements related to mobile subscribers may also be included. Optionally, the terminal equipment may also include other removable and/or fixed memories. Optionally, the terminal equipment may also include a volatile memory and/or a non-volatile memory. The volatile memory may include a random access memory (RAM) including a dynamic and/or static random access memory, an on-chip and/or off-chip cache memory, and the like. The non-volatile memory, which may be embedded and/or removable, may include a read-only memory, a flash memory, a magnetic storage device, such as a hard disk, a floppy disk drive, a magnetic tape, an optical disk drive and/or a media, and the like. Similar to the volatile memory, the non-volatile memory may include a cache area for temporary storage of data. At least a portion of the volatile and/or non-volatile memory may be embedded in the processor. The memory may store one or more software programs, instructions, information blocks, data, etc., which may be used by the terminal equipment to carry out functions of the mobile terminal. For example, the memory may include an identifier capable of uniquely identifying the terminal equipment, such as an International Mobile Equipment Marker (IMEI) code.

In some embodiments, the above-mentioned communication device provided by embodiments of the present disclosure may also be network equipment, including, but not limited to, a base station (NodeB), an evolved base station (eNodeB), a base station in the fifth generation (5G) communication system, a base station in a future communication system, an access node in a WiFi system, a wireless relay node, a wireless backhaul node, a wireless controller in a cloud radio access network (CRAN) scenario, a small station, a transmission reference point (TRP), etc.

Although the present disclosure has been described in connection with specific features and embodiments thereof, it is apparent that various modifications and combinations may be made thereto without departing from the spirit and scope of the present disclosure. Thus the present disclosure is also intended to encompass such modifications and variations to the extent that they fall within the scope of the claims of the present disclosure and their equivalents. Accordingly, the specification and drawings are merely exemplary illustrations of the disclosure as defined by the appended claims and are considered to have covered any and all modifications, variations, combinations or equivalents within the scope of the disclosure.

What is claimed is:

1. A micro-electromechanical system switch, comprising:
a substrate;
a direct current (DC) bias line, arranged on one side of the substrate;
a first signal transmission line and a second signal transmission line, arranged on a same side of the substrate as the DC bias line, wherein the first signal transmission line and the second signal transmission line are spaced side-by-side from the DC bias line, and the first signal transmission line and the second signal transmission line are arranged on two sides of the DC bias line;
a cantilever beam, arranged on a side, away from the substrate, of a layer on which the first signal transmission line is located; wherein the cantilever beam spans the DC bias line and a gap is provided between the cantilever beam and the DC bias line in a direction perpendicular to the substrate; the cantilever beam comprises a fixed end and a free end; the fixed end is connected to the second signal transmission line; an orthographic projection of the free end on the substrate is within an orthographic projection of the first signal transmission line on the substrate; and in the direction perpendicular to the substrate, a gap is provided between the free end and the first signal transmission line; and
a fixing structure, comprising a connecting portion and a fixing portion, and being not in contact with the first signal transmission line; wherein the connecting portion is arranged on the side, away from the substrate, of the layer on which the first signal transmission line is located,
wherein the connecting portion and the cantilever beam are disposed in a same plane parallel to the substrate; the connecting portion is connected to the free end, and the fixing portion connects the connecting portion and the substrate; and
a height of the fixing portion in the direction perpendicular to the substrate is larger than a thickness of the first signal transmission line in the direction perpendicular to the substrate.

2. The micro-electromechanical system switch of claim 1, wherein the fixing structure is integrally formed with the cantilever beam.

3. The micro-electromechanical system switch of claim 1, wherein the substrate is a flexible substrate.

4. The micro-electromechanical system switch of claim 1, wherein the DC bias line is symmetrically disposed about an extension direction of the cantilever beam.

5. The micro-electromechanical system switch of claim 1, wherein the DC bias line, the first signal transmission line, and the second signal transmission line are arranged in a same layer.

6. The micro-electromechanical system switch of claim 1, further comprising an isolation layer between a layer where the DC bias line is located and a layer where the cantilever beam is located;
wherein an orthographic projection of the isolation layer on the substrate coincides with an orthographic projection of the DC bias line on the substrate.

7. A communication device, comprising the micro-electromechanical system switch of claim 1.

8. The micro-electromechanical system switch of claim 1, wherein, within the plane, the connecting portion extends in a direction intersecting with the cantilever beam;

wherein the connecting portion comprises a first connecting portion, and within the plane, the first connecting portion extends from the free end towards a direction away from the free end; and the fixing portion comprises a first fixing portion that connects the first connecting portion and the substrate.

9. The micro-electromechanical system switch of claim 8, wherein the connecting portion further comprises a second connecting portion, and within the plane, the second connecting portion extends from the free end towards a direction away from the free end;

the second connecting portion and the first connecting portion are located on two sides of an extension direction of the cantilever beam;

the fixing portion comprises a second fixing portion that connects the second connecting portion and the substrate; and the second fixing portion and the first fixing portion are located on two sides of the extension direction of the cantilever beam.

10. The micro-electromechanical system switch of claim 9, wherein the fixing structure is disposed symmetrically about the extension direction of the cantilever beam.

11. The micro-electromechanical system switch of claim 10, wherein the first connecting portion is disposed orthogonal to the cantilever beam and the second connecting portion is disposed orthogonal to the cantilever beam.

12. The micro-electromechanical system switch of claim 10, wherein an included angle between the first connecting portion and the cantilever beam and an included angle between the second connecting portion and the cantilever beam are equal and both greater than 45° and less than 90°.

13. The micro-electromechanical system switch of claim 10, wherein an included angle between the first connecting portion and the cantilever beam and an included angle between the second connecting portion and the cantilever beam are equal and both greater than 90° and less than 135°.

14. The micro-electromechanical system switch of claim 9, wherein the fixing structure is disposed asymmetrically about the extension direction of the cantilever beam.

15. The micro-electromechanical system switch of claim 14, wherein an included angle between the first connecting portion and the cantilever beam is greater than 45° and less than 90°.

16. The micro-electromechanical system switch of claim 15, wherein an included angle between the second connecting portion and the cantilever beam is greater than 90° and less than 135°; or, an included angle between the second connecting portion and the cantilever beam is equal to 90°; or, an included angle between the second connecting portion and the cantilever beam is greater than 45° and less than 90°; and the included angle between the second connecting portion and the cantilever beam is not equal to the included angle between the first connecting portion and the cantilever beam.

17. The micro-electromechanical system switch of claim 14, wherein an included angle between the first connecting portion and the cantilever beam is greater than 90° and less than 135°.

18. The micro-electromechanical system switch of claim 17, wherein an included angle between the second connecting portion and the cantilever beam is equal to 90°; or an included angle between the second connecting portion and the cantilever beam is greater than 90° and less than 135°, and the included angle between the second connecting portion and the cantilever beam is not equal to the included angle between the first connecting portion and the cantilever beam.

19. The micro-electromechanical system switch of claim 8, wherein a distance between the fixing portion and the first signal transmission line in an extension direction of the DC bias line is greater than or equal to a distance between the connecting portion and the first signal transmission line in the direction perpendicular to the substrate;

wherein the distance between the fixing portion and the first signal transmission line in the extension direction of the DC bias line is at least one time the distance between the connecting portion and the first signal transmission line in the direction perpendicular to the substrate.

20. The micro-electromechanical system switch of claim 8, wherein the fixing portion is arranged adjacent an end of the first signal transmission line; and/or the fixing portion is arranged adjacent a gap between the first signal transmission line and the DC bias line.

* * * * *